(12) United States Patent
Hsu et al.

(10) Patent No.: US 6,946,738 B2
(45) Date of Patent: Sep. 20, 2005

(54) SEMICONDUCTOR PACKAGING SUBSTRATE AND METHOD OF PRODUCING THE SAME

(75) Inventors: Chi-Hsing Hsu, Taipei Hsien (TW); Wen-Yuan Chang, Hsinchu (TW)

(73) Assignee: Via Technologies, Inc., Taipei Hsien (TW)

(*) Notice: Subject to any disclaimer, the term of this patent is extended or adjusted under 35 U.S.C. 154(b) by 132 days.

(21) Appl. No.: 10/144,121

(22) Filed: May 10, 2002

(65) Prior Publication Data

US 2003/0122213 A1 Jul. 3, 2003

(30) Foreign Application Priority Data

Dec. 28, 2001 (TW) ............................ 90132738 A

(51) Int. Cl.[7] ............................................. H01L 23/522
(52) U.S. Cl. .................. 257/774; 257/758; 257/700; 257/692
(58) Field of Search ................ 257/758, 774, 257/508, 701, 700, 692, 737, 738, 503, 690, 750, 694, 695

(56) References Cited

U.S. PATENT DOCUMENTS

| | | | | |
|---|---|---|---|---|
| 3,675,318 A | * | 7/1972 | Merkenschlager | 29/852 |
| 4,642,160 A | * | 2/1987 | Burgess | 216/18 |
| 5,331,204 A | * | 7/1994 | Kuroda et al. | 257/758 |
| 5,473,120 A | * | 12/1995 | Ito et al. | 174/264 |
| 5,483,101 A | * | 1/1996 | Shimoto et al. | 257/701 |
| 5,509,200 A | * | 4/1996 | Frankeny et al. | 29/852 |
| 5,637,920 A | * | 6/1997 | Loo | 257/700 |
| 5,685,070 A | * | 11/1997 | Alpaugh et al. | 29/840 |
| 5,710,071 A | * | 1/1998 | Beddingfield et al. | 438/108 |
| 5,798,563 A | * | 8/1998 | Feilchenfeld et al. | 257/668 |
| 5,847,327 A | * | 12/1998 | Fischer et al. | 174/258 |
| 5,883,335 A | * | 3/1999 | Mizumoto et al. | 174/266 |
| 5,906,042 A | * | 5/1999 | Lan et al. | 29/852 |
| 5,959,348 A | * | 9/1999 | Chang et al. | 257/700 |
| 6,378,201 B1 | * | 4/2002 | Tsukada et al. | 29/852 |
| 6,492,600 B1 | * | 12/2002 | Jimarez et al. | 174/262 |
| 6,545,876 B1 | * | 4/2003 | Kwong et al. | 361/780 |
| 6,548,767 B1 | * | 4/2003 | Lee et al. | 174/262 |
| 6,555,016 B2 | * | 4/2003 | Lai | 216/18 |

* cited by examiner

Primary Examiner—Tom Thomas
Assistant Examiner—Eugene Lee
(74) Attorney, Agent, or Firm—J.C. Patents

(57) ABSTRACT

A semiconductor packaging substrate and a process for producing the same is disclosed. An internal circuit is formed by lamination. Then, external circuit is formed on the internal circuit by build-up technology. The substrate can be used as a flip-chip ball grid array packaging substrate with high density and small pitch. Furthermore, the substrate of the invention has a plurality of bonding pads thereon. The bump pads are divided into power/ground bump pads, first signal bump pads, and second signal bump pads. The first signal bump pads surround the power/ground bump pads and are surrounded by the second signal bump pads.

8 Claims, 5 Drawing Sheets

007
SEMICONDUCTOR PACKAGING SUBSTRATE AND METHOD OF PRODUCING THE SAME

CROSS-REFERENCE TO RELATED APPLICATION

This application claims the priority benefit of Taiwan application serial no. 90132738, filed Dec. 28, 2001.

BACKGROUND OF THE INVENTION

1. Field of Invention

The present invention relates to a semiconductor packaging substrate and a process for producing the same. More specifically, the present invention relates to a semiconductor substrate that can be used in flip-chip ball grid array packaging.

2. Description of Related Art

Flip chip packaging has been a popular packaging technology. In flip chip packaging, bump pads are arranged in area array on an active surface of a chip. Bumps are formed on the corresponding bump pads to electrically connect the chip to the carrier. Flip chip packaging has many advantages such as reduced package area, increased package density, and reduced signal path. A rigid substrate is usually used as a packaging carrier, because it can provide high-density and high-pin-count layout. Generally, the rigid substrate is formed by lamination or build-up.

In the rigid substrate lamination process, more than one single-sided or double-sided sheets having copper foil thereon are provided. Each of the copper foils is patterned to form a patterned metal layer. A bonding sheet is interposed between the sheets and bonded with them by thermal compression. Then, mechanically drilling and plating processes are sequentially performed to form plating through holes (PTH) though the sheets for electrically connecting the metal layers.

In the rigid substrate build-up process, insulation layers and patterned metal layers are sequentially formed on an insulated core base. The metal layers are electrically connected to one another by at least one contact via. The contact via is formed by forming a through hole in the insulation layers and the patterned metal layers and then plating to fill the through hole. Forming the through hole is achieved by non-mechanically drilling process such as photo-via forming, laser ablating and plasma etching.

FIG. 1 is a schematic, cross-sectional view of a conventional flip-chip ball grid array packaging substrate obtained by build-up technology. The packaging substrate 100 has a core 110 having copper foils on both sides thereof as a base. The copper foils are patterned to form metal layers 112 on both sides of the base. Mechanically drilling and plating processes are sequentially performed to form vias 114 for electrically connecting with the metal layers 112. Insulation layers 120a are respectively formed on the metal layers 112. Then, each of the insulation layers 120a is subject to non-mechanically drilling such as photo-via forming, laser ablating and plasma etching to form a first opening therein, respectively. A plating process is performed to form a via 140a in each of the first openings and form metal layers 130a respectively on the insulation layers 120a. The metal layers 130a are electrically connected to the metal layers 112 through the vias 140a. Similarly, the insulation layers 120b, the metal layers 130b and the vias 140b are formed in the same way recited above. Finally, solder masks 150 are formed over the whole structure, while partially exposing the outmost metal layers 130b for external connection. The exposed portions of the outmost metal layer 130b on a top of the structure are used as bump pads 132, and those on a bottom of the structure are used as ball pads 134.

In accordance with flip-chip ball grid array (FCBGA) packaging, when the bump pitch is less than 240 micron, the layout thereof is limited to 40 micron/40 micron (line width/line pitch) design rule. Since a high-density and small-pitch packaging substrate can be obtained by build-up technology, such a packaging substrate can meet the requirement of a high-pin-count device. Currently, the FCBGA substrate has six layers and is formed by build-up fabrication. The number of build-up layers increases with the circuit density increases. However, the FCBGA substrate has disadvantages of low yield and high production cost.

SUMMARY OF INVENTION

It is an object of the present invention to provide a semiconductor packaging substrate and a process for producing the same. A laminated circuit is an inner circuit instead of a build-up circuit that is commonly used in the art. Thereby, the yield of a flip-chip ball grid array substrate is increased with reduced production cost.

In one aspect of the invention, a semiconductor packaging substrate including a laminated circuit, the laminated circuit includes a plurality of patterned internal metal layers stacked up, a plurality of insulation layers, and at least one contact via is provided. Each of the insulation layers is interposed between two adjacent internal metal layers. The contact via is formed through the metal layers and the insulation layers, so that the stacked metal layers are electrically connected to one another. In another aspect of the invention, the packaging substrate also includes a build-up structure, in which the first external insulation layer and a second external insulation layer are respectively arranged on a first surface and a second surface of the laminated circuit. The first external insulation layer has a first opening for forming a first via. The second external insulation layer has a second opening for forming a second via. A first via is formed in the first opening, and a second via is formed in the second opening. A first external metal layer is located on the first external insulation layer. A second external metal layer is located on the second external insulation layer. The first external metal layer is electrically connected to the first via, and the second external metal layer is electrically connected to the second via, such that the first and second external metal layers are electrically connected to the metal layers of the internal laminated circuit.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
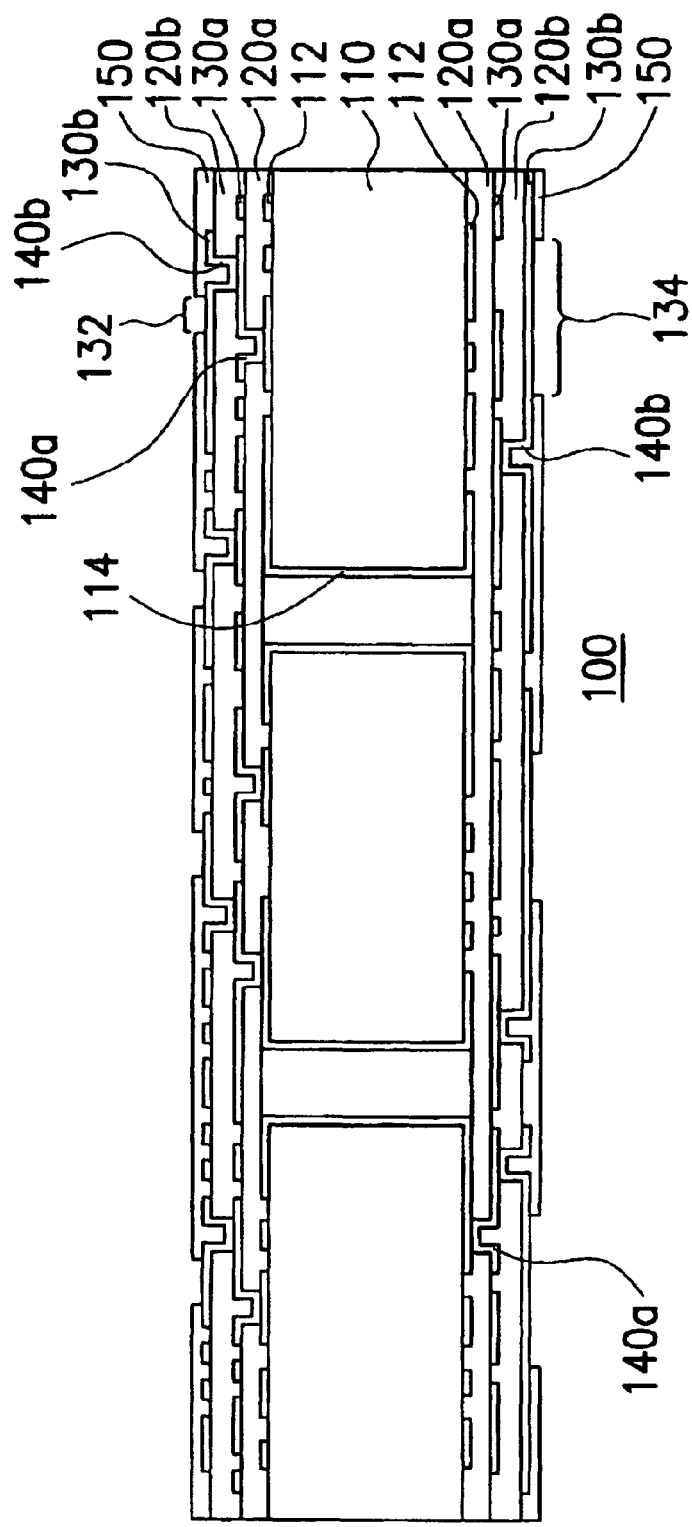
FIG. 1 is a schematic cross-sectional view of a conventional flip-chip ball grid array packaging substrate.

Reference will now be made in detail to the present preferred embodiments of the invention, examples of which are illustrated in the accompanying drawings. Wherever possible, the same reference numbers are used in the drawings and the description to refer to the same or like parts.

Figure 2:
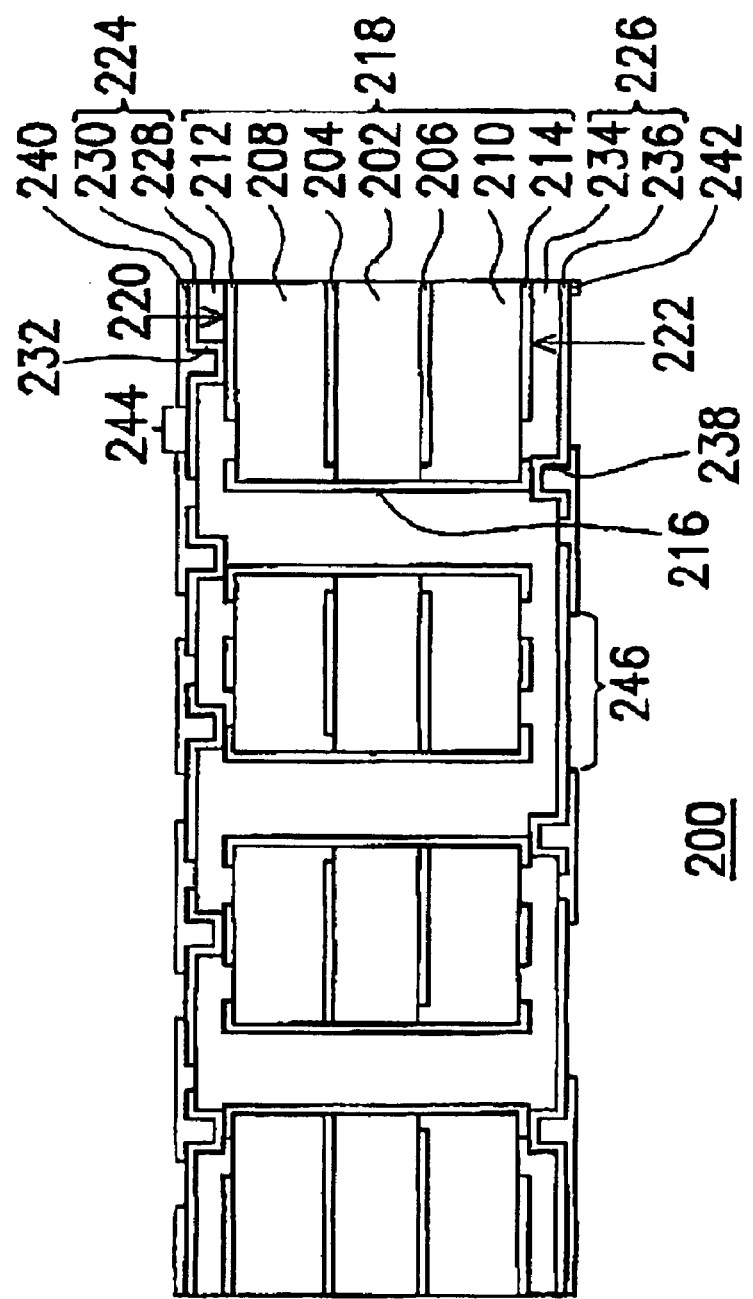
FIG. 2 is a schematic, cross-sectional view of a semiconductor packaging substrate according to one preferred embodiment of the present invention.

FIG. 2 is a schematic cross sectional view of a semiconductor packaging substrate according to a preferred embodiment of the present invention. A semiconductor packaging substrate 200 includes a core 202, and metal layers 204, 206 formed on a top and a bottom surface of the core 202, respectively. The core 202 can be made of glass epoxy resin, bismaleimide-triazine (BT) resin or epoxy resin. The metal layers 204, 206 are formed by providing a copper layer on the core 202 and patterning the copper layer. An insulation layer 208 having a patterned metal layer 212 thereon, and an insulation layer 210 having a patterned metal layer 214 thereon are provided. The insulation layers 208, 210 are adhered to the top and the bottom of the core 202, respectively, with the patterned metal layers 212, 214 exposed. At least one contact via 216 is formed through the insulation layers 208, 210 and the core 202 for electrically connecting the metal layers 204, 206, 212 and 214. A laminated internal circuit 218 is therefore accomplished.

Thereafter, build-up circuits 224, 226 are formed on a top surface 220 and a bottom surface 222 of the laminated internal circuit 218, respectively. The build-up circuit 224 consists of an insulation layer 228, a patterned metal layer 230 and a plurality of vias 232. Similarly, the build-up circuit 226 consists of an insulation layer 234, a patterned metal layer 236 and a plurality of vias 238. The build-up circuit 224 is fanned in the following steps. The insulation layer 228 is formed on the top surface 220 of the laminated circuit 218. An opening is formed in the insulation layer 228 in a non-mechanic way, such as by a photo via forming, laser ablating or plasma etching. A plating process is performed to form a metal layer 230 on the insulation layer 228 and a via 232 filling the opening at the same time. The via 232 electrically connects the metal layer 230 to the metal layer 212 of the laminated circuit 218. The opening formed by laser ablating has a smaller diameter than the contact via 216 formed by mechanically drilling.

Subsequently, a solder mask 240 is formed on the insulation layer 228 and the metal layer 230, exposing a portion of the metal layer 230 for forming pads 244. Similarly, a solder mask 242 is formed on the insulation layer 234 and the metal layer 236, exposing a portion of the metal layer 236 for forming pads 246. In this embodiment of the present invention, such a semiconductor packaging substrate 200 is used in flip-chip BGA packaging; therefore, the pads 244 serve as bump pads, and the pads 246 serve as solder ball pads for attaching solder balls.

The embodiment of the present invention shown in FIG. 2 is illustrated by exemplifying a six-layered semiconductor packaging substrate. However, the number of the internal laminated circuit layer or the external build-up circuit layer can be varied according to the number of bumps for easier circuit layout. After most of the circuit structure of the package substrate 200 is achieved by the lamination, the pads 244, 246 are respectively formed by build-up technology for external connections. Lamination technology is well known and used in the art to produce semiconductor packaging substrates. Therefore, the yield of producing the packaging substrates, especially a Flip Chip BGA packaging substrate, is substantially increased by forming the internal circuit by lamination and forming the external circuits and pads by build-up fabrication.

Figure 3:
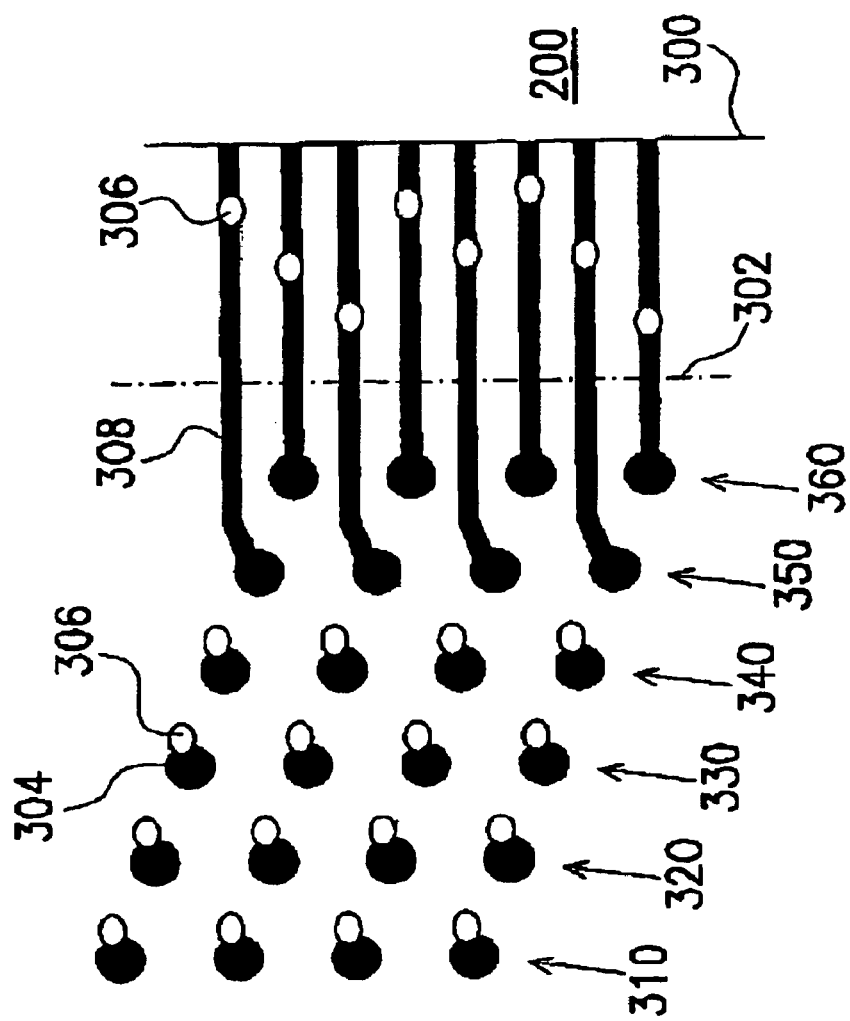
FIG. 3 is a schematic enlarged view showing the layout of a first metal layer 230 of FIG. 2.
Figure 4:
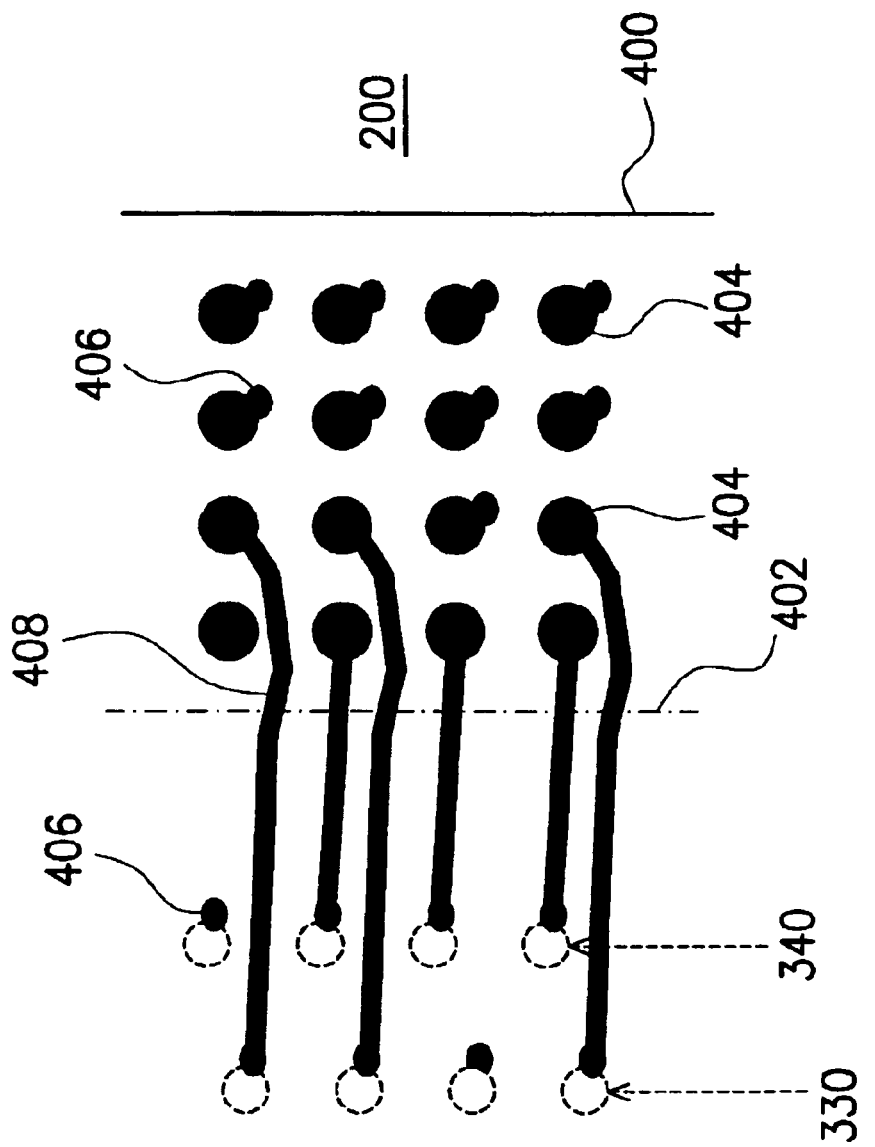
FIG. 4 is a schematic enlarged view showing the layout of a sixth metal layer 236 of FIG. 2.
Figure 5:
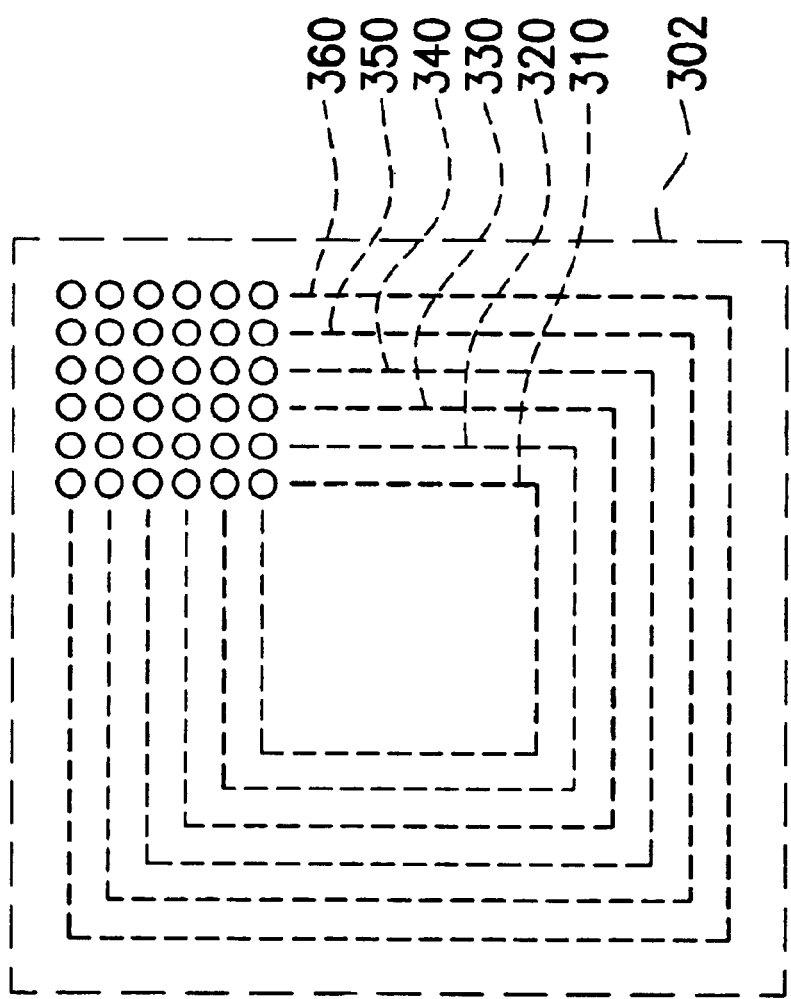
FIG. 5 schematically shows a bump pad of a semiconductor packaging substrate according to one preferred embodiment of the present invention.

FIG. 3 is a schematic, local layout of a first metal layer 230 of the substrate as shown in FIG. 2. FIG. 4 is a schematic, local layout of a sixth metal layer 236 of the substrate as shown in FIG. 2. FIG. 5 is a schematic, local layout of the (bump pads of the substrate as shown in FIG. 2. As shown in FIG. 5, the bump pads of the substrate 200 are arranged in array. The bump pads 244 in FIG. 2 are the same as the bump pads 304 in FIGS. 3 and 5. The ball pads 246 in FIG. 2 are the same as the ball pads 404 in FIG. 4. It is noted that the internal pads serve as power/ground bump pads 310, 320, the middle pads serve as first signal bump pads 330, 340, and the outer pads serve as second signal bump pads 350, 360, as shown in FIG. 5.

In FIG. 3, reference numeral 300 is an edge of the substrate 200, and reference numeral 302 is a chip edge on the substrate 200. The power/ground bump pads 310, 320 are routed to the third metal layer 204 and the fourth metal layer 206 through a via 306 (i.e. 232 in FIG. 2), and then routed to the ball pad 246 (i.e. 404 of FIG. 4) through the contact via 216, the fifth metal layer 214, the via 238 (i.e. 406 in FIG. 4), and the trace 408 on the sixth metal layer 236. The third and fourth metal layers 204, 206 serve as power/ground planes.

The first signal pads 330, 340 are routed to the sixth metal layer 236 sequentially through the via 306 (i.e. 232 of FIG. 2), the second metal layer 212 of FIG. 2, the contact via 216 of FIG. 2, the fifth metal layer 214 of FIG. 2, and the via 238 (i.e. 406 of FIG. 4), and then fanned out through trace 408 to the ball pad 404 of FIG. 4 (i.e. 246 on the sixth metal layer 236).

The second signal bump pads 350, 360 are fanned out to the chip edge 302 by trace 308 on the first metal layer 230, and then connect to the ball pad 246 (i.e. 404 of FIG. 4) through the via 306 (i.e. 232 of FIG. 2), the second metal layer 212, the contact via 216, the fifth metal layer 214, the via 238 (i.e. 406 of FIG. 4) and the sixth metal layer 236 (i.e. 408 of FIG. 4).

The layout of the package substrate according to the present invention is achieved by fanning the second signal bump pads out to the chip edge through the trace on the first metal layer and then routing to the ball pads, as well as by routing the first signal bump pads to the sixth metal layer and then fanning out to the ball pads on the sixth metal layer. When the first and sixth metal layers can not provide enough space for routing, the second, fourth and fifth metal layers can be used for routing, thereby downwardly routing the first metal layer and then fanning out to the sixth metal layer.

In view of the foregoing, the invention preferably uses lamination technology to form a laminated circuit. Then, the external circuit is formed by build-up technology. The package substrate thus obtains characteristics such as high circuit density and small pitch, which is advantageously used as a flip-chip ball grid array package substrate. Since the lamination technology has been well used in the art, with a laminated circuit as a portion of the package substrate the yield of the substrate is increased, with reduced production cost.

Furthermore, the bump pads on the top of the semiconductor packaging substrate of the invention serve as power/ground bump pads, the first signal bump pads and the second signal bump pads. The power/ground bump pads are located near the center of the substrate. The first signal bump pads are distributed around the power/ground bump pads. The second signal bump pads are located around the first signal bump pads. The substrate has several metal layers arranged sequentially from the top to the bottom. Among the layers, the middle layers of the substrate serve as power/ground planes.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor packaging substrate, comprising:

a first, second, third, fourth, fifth, and sixth patterned metal layers sequentially stacked up, wherein the first metal layer bas a plurality of power/ground bump pads, a plurality of first signal bump pads and a plurality of second signal bump pads, and wherein the first signal bump pads surround the power/ground bump pads and are surrounded by the second signal bump pads, and wherein the sixth metal layer has a plurality of ball pads;

a plurality of inner insulation layers, located between the second and third metal layers, between the third and fourth metal layers, and between the fourth and fifth metal layers;

at least one contact via formed through the insulation layers and the second, the third, the fourth, and the fifth metal layers, such that at least two of the second, the third, the fourth, and the fifth metal layers are electrically connected to one another;

a first external insulation layer and a second external insulation layer arranged between the first and second metal layers and between the fifth and the sixth metal layers, respectively, and at least one first via formed through the first external insulation layer and at least one second via formed through the second external insulation layer, thereby the first metal layer being electrically connected to the second metal layer through the first via, and the sixth metal layer being electrically connected to the fifth metal layer through the second via;

wherein the first signal bump pads are routed to the sixth metal layer and then fanned out to the corresponding ball pads, the second signal bump pads are fanned out on the first metal layer and then routed to the corresponding ball pads, and the power/ground bump pads are routed to the third and fourth metal layers and then fanned out to the corresponding ball pads.

2. The substrate of claim 1, further comprising a first solder mask arranged on the first external metal layer to cover the first external insulation layer and expose the power/ground bump pads, the first signal bump pads and the second signal bump pads.

3. The substrate of claim 1, further comprising a second solder mask arranged the sixth metal layer to cover the second external insulation layer and expose the ball pads.

4. The substrate of claim 1, wherein the substrate is used as a flip-chip ball grid array packaging substrate.

5. A semiconductor packaging substrate, comprising:

N patterned metal layers sequentially stacked up, wherein N is a natural number larger than 6, the first metal layer has a plurality of power/ground bump pads, a plurality of first signal bump pads and a plurality of second signal bump pads, and wherein the first signal bump pads surround the power/ground bump pads and are surrounded by the second signal bump pads, and wherein the Nth metal layer has a plurality of ball pads;

a plurality of inner insulation layers, located between the 2nd and 3rd metal layers, between the 3rd and 4th metal layers, . . . and between the (N−2)th and (N−1)th metal layers; at least one contact via formed through the insulation layers and at least two of the 2nd to (N−1)th metal layers are electrically connected to one another;

a first external insulation layer and a second external insulation layer arranged between the 1st and 2nd metal layers and between the (N−1)th and the Nth metal layers, respectively; and at least one first via formed through the first external insulation layer and at least one second via formed through the second external insulation layer, thereby the first metal layer being electrically connected to the second metal layer through the first via, and the Nth metal layer being electrically connected to the (N−1)th metal layer through the second via;

wherein the first signal bump pads are routed to the Nth metal layer and then fanned out to the corresponding ball pads, the second signal bump pads are fanned out on the first metal layer and then routed to the corresponding ball pads , and the power/ground bump pads are routed to the third and (N−2)th metal layers and then fanned out to the corresponding ball pads.

6. The substrate of claim 5, further comprising a first solder mask arranged on the first external metal layer to cover the first external insulation layer and expose the power/ground bump pads, the first signal bump pads and the second signal bump pads.

7. The substrate of claim 5, further comprising a second solder mask arranged the Nth metal layer to cover the second external insulation layer and expose the ball pads.

8. The substrate of claim 5, wherein the substrate is used as a flip-chip ball grid array packaging substrate.

* * * * *